United States Patent [19]
Brooks et al.

[11] Patent Number: 6,034,611
[45] Date of Patent: Mar. 7, 2000

[54] ELECTRICAL ISOLATION DEVICE

[75] Inventors: Stanley J. Brooks, Rockvale, Tenn.; James W. Dickens, Lexington, Ky.

[73] Assignee: Square D Company, Palatine, Ill.

[21] Appl. No.: 08/794,848

[22] Filed: Feb. 4, 1997

[51] Int. Cl.$^7$ .................................................... G08B 21/00
[52] U.S. Cl. ......................... 340/647; 340/644; 340/659; 340/691.6; 324/424; 324/536; 361/119
[58] Field of Search ................................. 340/649, 660, 340/662, 664, 659, 635, 641, 644, 691.6; 361/111, 113, 119; 324/424, 526

[56] References Cited

U.S. PATENT DOCUMENTS

| | | | |
|---|---|---|---|
| H536 | 10/1988 | Strickland et al. | 324/456 |
| Re. 30,678 | 7/1981 | Van Zeeland et al. | 361/44 |
| 2,808,566 | 10/1957 | Douma | 324/127 |
| 2,832,642 | 4/1958 | Lennox | 299/132 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |
| 3,600,502 | 8/1971 | Wagenaar et al. | 174/143 |
| 3,622,872 | 11/1971 | Boaz et al. | 324/52 |

(List continued on next page.)

FOREIGN PATENT DOCUMENTS

| | | |
|---|---|---|
| 0 094 871 A1 | 5/1983 | European Pat. Off. . |
| 0 615 327 | 9/1994 | European Pat. Off. ......... H02H 1/00 |
| 0 649 207 A1 | 4/1995 | European Pat. Off. . |
| 0 748 021 A1 | 12/1996 | European Pat. Off. . |
| 0 762 591 A2 | 3/1997 | European Pat. Off. . |
| 0 802 602 A2 | 10/1997 | European Pat. Off. . |
| 2 177 561 | 6/1985 | United Kingdom . |
| 2285886A | 7/1995 | United Kingdom . |
| WO 97/30501 | 8/1997 | WIPO . |

OTHER PUBLICATIONS

Antonio N. Paolantonio, P.E., Directional Couplers, R.F. Design, Sep./Oct., 1979, pp. 40–49.

Alejandro Duenas, J., Directional Coupler Design Graphs For Parallel Coupled Lines and Interdigitated 3 dB Couplers, RF Design, Feb., 1986, pp. 62–64.

RV4145 Low Power Ground Fault Interrupter, Preliminary Product Specifications of Integrated Circuits, Raytheon Company Semiconductor Division, 350 Ellis Street, Mountain View CA 94309–7016, pp. 1–8.

Jean–Francois Joubert, Feasibility of Main Service Ground–Fault Protection On The Electrical Service To Dwelling Units, Consultants Electro–Protection Ins., 1980, Michelin St., Laval, Quebec H7L 9Z7. Oct. 26, 1990, pp. 1–77.

R.D. Russell, Detection Of Arcing Faults On Distribution Feeders, Texas A & M Research Foundation, Box H. College Station, Texas 77843, Final Report Dec., 1982, pp. 1–B18.

(List continued on next page.)

Primary Examiner—Daniel J. Wu
Attorney, Agent, or Firm—Kareem M. Irfan; Larry I. Gordon

[57] ABSTRACT

An electrical isolation device for use in an electrical distribution network having a plurality of branch circuits each defined by line and neutral conductors connected between a power source and a load, the line conductor being electrically connected to one of a plurality of line buses at an electrical distribution panelboard, the neutral conductor being electrically connected to a neutral bus at the electrical distribution panelboard. The isolation device includes a filter coupled between a selected number of line buses and the neutral bus at the panelboard and is designed to provide a low impedance path for an arcing fault occurring on either of the selected number of line buses. In another embodiment, the isolation device is comprised of a filter coupled between the line and neutral conductor of a selected one of the branch circuits and is designed to provide a low impedance path for an arcing fault occurring on the line conductor of the selected branch circuit.

31 Claims, 4 Drawing Sheets

U.S. PATENT DOCUMENTS

| | | | |
|---|---|---|---|
| 3,684,955 | 8/1972 | Adams | 324/72 |
| 3,746,930 | 7/1973 | Van Best et al. | 317/31 |
| 3,775,675 | 11/1973 | Freeze et al. | 324/51 |
| 3,812,337 | 5/1974 | Crosley | 235/153 AC |
| 3,858,130 | 12/1974 | Misencik | 335/18 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,914,667 | 10/1975 | Waldron | 317/36 |
| 3,939,410 | 2/1976 | Bitsch et al. | 324/72 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,354,154 | 10/1982 | Schiemann | 324/126 |
| 4,356,443 | 10/1982 | Emery | 324/51 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,616,200 | 10/1986 | Fixemer et al. | 335/35 |
| 4,639,817 | 1/1987 | Cooper et al. | 361/62 |
| 4,642,733 | 2/1987 | Schacht | 361/363 |
| 4,644,439 | 2/1987 | Taarning | 361/87 |
| 4,652,867 | 3/1987 | Masot | 340/638 |
| 4,658,322 | 4/1987 | Rivera | 361/37 |
| 4,697,218 | 9/1987 | Nicolas | 633/882 |
| 4,702,002 | 10/1987 | Morris et al. | 29/837 |
| 4,707,759 | 11/1987 | Bodkin | 831/642 |
| 4,771,355 | 9/1988 | Emery et al. | 361/33 |
| 4,810,954 | 3/1989 | Fam | 324/142 |
| 4,835,648 | 5/1989 | Yamauchi | 361/14 |
| 4,845,580 | 7/1989 | Kitchens | 361/91 |
| 4,853,818 | 8/1989 | Emery et al. | 361/33 |
| 4,858,054 | 8/1989 | Franklin | 361/57 |
| 4,866,560 | 9/1989 | Allina | 361/119 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,010,438 | 4/1991 | Brady | 361/56 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,166,861 | 11/1992 | Krom | 361/379 |
| 5,168,261 | 12/1992 | Weeks | 340/515 |
| 5,179,491 | 1/1993 | Runyan | 361/45 |
| 5,185,684 | 2/1993 | Beihoff et al. | 361/45 |
| 5,185,685 | 2/1993 | Tennie et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/536 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham | 200/144 B |
| 5,307,230 | 4/1994 | MacKenzie | 361/96 |
| 5,334,939 | 8/1994 | Yarbrough | 324/424 |
| 5,353,014 | 10/1994 | Carroll et al. | 340/638 |
| 5,359,293 | 10/1994 | Boksiner et al. | 324/544 |
| 5,363,269 | 11/1994 | McDonald | 367/45 |
| 5,383,084 | 1/1995 | Gershen et al. | 361/113 |
| 5,388,021 | 2/1995 | Stahl | 361/56 |
| 5,412,526 | 5/1995 | Kapp et al. | 361/56 |
| 5,414,590 | 5/1995 | Tajali | 361/669 |
| 5,420,740 | 5/1995 | MacKenzie et al. | 361/45 |
| 5,434,509 | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,459,630 | 10/1995 | MacKenzie et al. | 361/45 |
| 5,483,211 | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,506,789 | 4/1996 | Russell et al. | 364/492 |
| 5,510,946 | 4/1996 | Franklin | 361/56 |
| 5,512,832 | 4/1996 | Russell et al. | 324/522 |
| 5,519,561 | 5/1996 | Mrenna et al. | 361/105 |
| 5,531,617 | 7/1996 | Marks | 439/723 |
| 5,546,266 | 8/1996 | Mackenzie et al. | 361/93 |
| 5,561,605 | 10/1996 | Zuercher et al. | 364/483 |
| 5,568,371 | 10/1996 | Pitel et al. | 363/39 |
| 5,578,931 | 11/1996 | Russell et al. | 324/536 |
| 5,590,012 | 12/1996 | Dollar | 361/113 |
| 5,602,709 | 2/1997 | Al-Dabbagh . | |
| 5,608,328 | 3/1997 | Sanderson | 324/529 |
| 5,657,244 | 8/1997 | Seitz | 364/492 |
| 5,659,453 | 8/1997 | Russell et al. | 361/93 |
| 5,682,101 | 10/1997 | Brooks et al. | 324/536 |
| 5,691,869 | 11/1997 | Engel et al. | 361/42 |
| 5,729,145 | 3/1998 | Blades | 324/536 |
| 5,805,397 | 9/1998 | MacKenzie | 361/42 |
| 5,805,398 | 9/1998 | Rae | 361/42 |
| 5,815,352 | 9/1998 | Mackenzie | 361/42 |
| 5,818,237 | 10/1998 | Zuercher et al. | 324/536 |
| 5,818,671 | 10/1998 | Seymour et al. | 361/42 |
| 5,834,940 | 11/1998 | Brooks et al. | 324/424 |
| 5,835,319 | 11/1998 | Welles, II et al. | 361/5 |
| 5,835,321 | 11/1998 | Elms et al. | 361/45 |

OTHER PUBLICATIONS

U.S. application No. 08/402,678, Mar. 13, 1995, Device and Method for Blocking Selected Arcing Fault Signals (Abandoned).

U.S. application No. 08/403,033, Mar. 13, 1995, Current Sensing Arcing Fault Detector and Method (Abandoned).

U.S. application No. 08/402,575, Mar. 13, 1995, Arcing Fault Detection System and Method (Abandoned).

U.S. application No. 08/403,084, Mar. 13, 1995, Device and Method for Testing Arcing Fault detectors (Abandoned).

U.S. application No. 08/600,512, Feb. 13, 1996, Arcing Fault Detection System.

U.S. application No. 08/719,972, Sep. 24, 1996, Arcing Fault Dectector Testing and Demonstration System.

U.S. application No. 08/788,969, Jan. 24, 1997, Apparatus and Method for Testing an Arcing Fault Detection System.

U.S. application No. 08/789,659, Jan. 27, 1997, Arcing Fault Detection System for a Secondary Line of a Current Transformer.

U.S. application No. 08/825,005, Mar. 26, 1997, Fault Detection Using Fluctuations in Current Peaks and Subharmonics.

U.S. application No. 08/796,745, Feb. 6, 1997, Split Core Sensor.

U.S. application No. 08/799,095, Feb. 11, 1997, Arc Fault Detection System Installed in a Panelboard.

U.S. application No. 08/804,420, Feb. 21, 1997, Arc Fault Trip Indicator for Miniature Circuit Breaker.

U.S. application No. 08/814,754, Mar. 7, 1997, Arc Fault Detection System.

U.S. application No. 08/827,031, Mar. 25, 1997, Electronically Controlled Circuit Breaker with Integrated Latch Tripping.

ELECTRICAL ISOLATION DEVICE

FIELD OF THE INVENTION

The present invention relates to protective devices used in electrical distribution systems. Specifically, the present invention relates to isolation devices which isolate arcing fault signals to one of a plurality of branch circuits in an electrical distribution system.

SUMMARY OF THE INVENTION

It is an object of the present invention to provide an electrical isolation device where high frequency arcing fault signals are isolated to the electrical branch of the electrical distribution network where they occur.

It is a further object of the present invention to provide an isolation device adaptable for use on the power side of an arcing fault detector in an electrical distribution network.

It is yet another object of the invention to provide an isolation device that is adaptable for use in an electrical distribution panelboard.

It is a further object of the invention to provide an isolation device which also protects the electrical distribution network from voltage surges.

In accordance with the present invention, the foregoing objectives are realized by providing an isolation device for use in an electrical distribution network, the network having a plurality of branch circuits defined by line and neutral conductors connected between a power source and load, the line and neutral conductors being electrically connected to respective line and neutral buses in an electrical distribution panelboard, the isolation device comprising filter means for providing a low impedance path for an arcing fault signal occurring in a selected one of the branch circuits, the filter means being coupled between the line and neutral buses in the electrical distribution network.

DETAILED DESCRIPTION OF THE PREFERRED EMBODIMENT

Figure 1A:
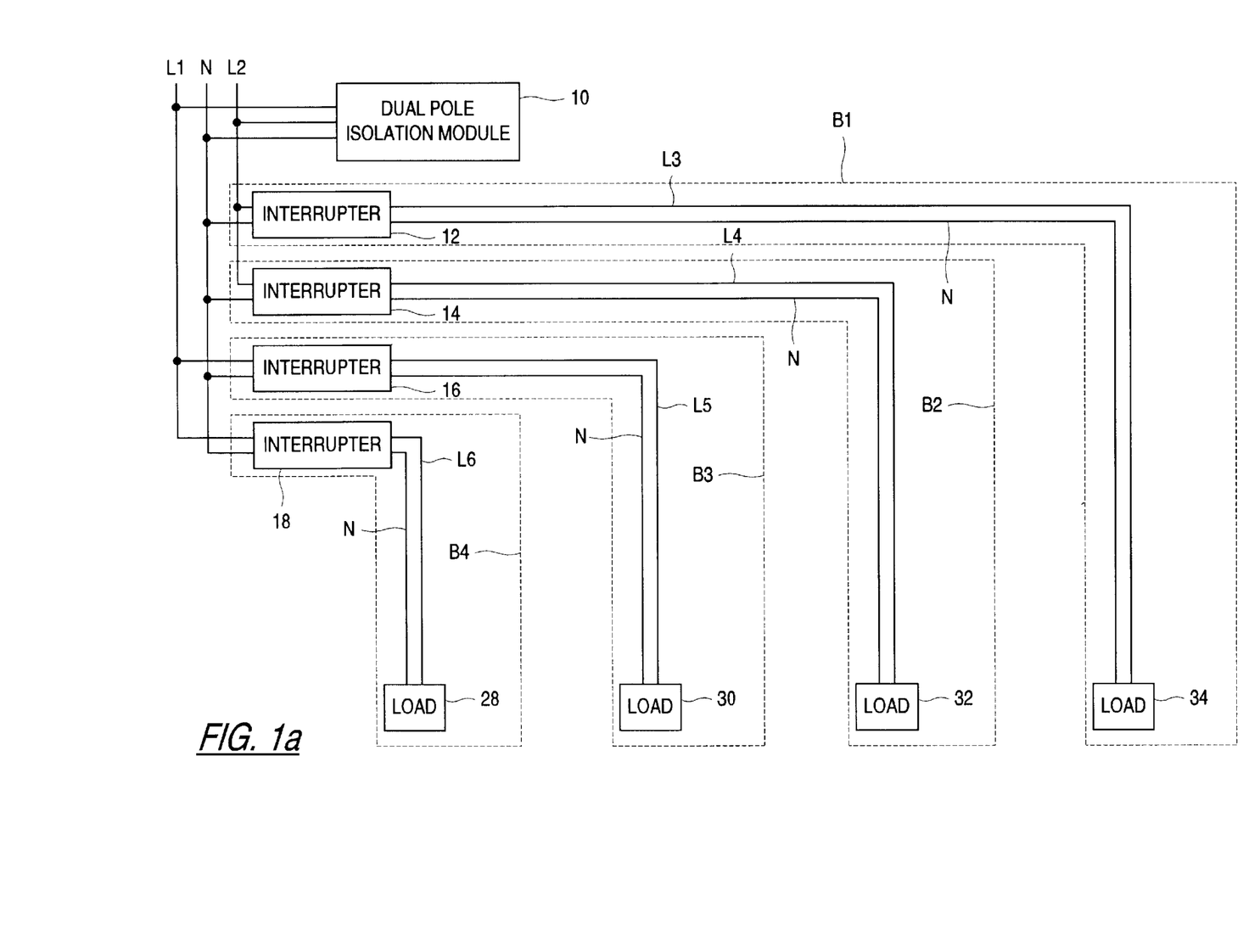
FIG. 1a is a block diagram of an electrical distribution network using an isolation device according to principles of the present invention.

As shown in FIG. 1a, a dual-pole isolation device 10 is connected to a first line bus L1, a second line bus L2, and a neutral bus N of an electrical distribution network. The electrical distribution network delivers electrical power from a power source (not shown) to branch circuits B1, B2, B3 and B4 each including respective line conductors L3, L4, L5 and L6 and a neutral conductor N for delivering electrical power to respective loads 34, 32, 30 and 28. Line interrupters 12, 14, 16 and 18 are attached to the respective line conductors L3, L4, L5 and L6 of each branch circuit between the power source and the load. The line bus L2 is connected to line interrupters 12 and 14 while line bus L1 is connected to interrupters 16 and 18. The line interrupters 12, 14, 16, and 18 are designed to break the current flow in a particular branch circuit B1, B2, B3, and B4 when an arcing fault is detected in the branch circuit. However, it will be appreciated that the electrical distribution network heretofore described is exemplary only.

The dual-pole isolation device 10 is designed to ensure that high frequency arcing fault signals present on either of the branch circuits B1, B2, B3 or B4 are isolated to the branch circuit on which the arcing fault occurred, thus ensuring that only the line interrupter associated with the branch circuit in which the arcing fault occurred is tripped. More specifically, the isolation device 10 ensures that an arcing fault signal present in branch circuit B1 will not trip line interrupters 14, 16 or 18, but rather will trip only line interrupter 12. Similarly, the isolation device 10 ensures that an arcing fault signal present in either of branch circuits B2, B3 and B4 will trip only respective line interrupters 14, 16 and 18. This is achieved by providing a low impedance path from line bus L1 to neutral bus N and from line bus L2 to neutral bus N, so that arcing fault signals in either of the branch circuits B1, B2, B3 and B4 are effectively shorted at line bus L1 or L2, thus preventing "false" arcing fault signals in the other branch circuits. By completing the arcing fault signal path, the isolation device 10 also serves to increase the signal strength at the arc fault detector in the branch circuit in which the arcing fault occurred. Preferably, the isolation device 10 also includes surge protection circuitry which protects the electrical distribution network from voltage surges.

Figure 1B:
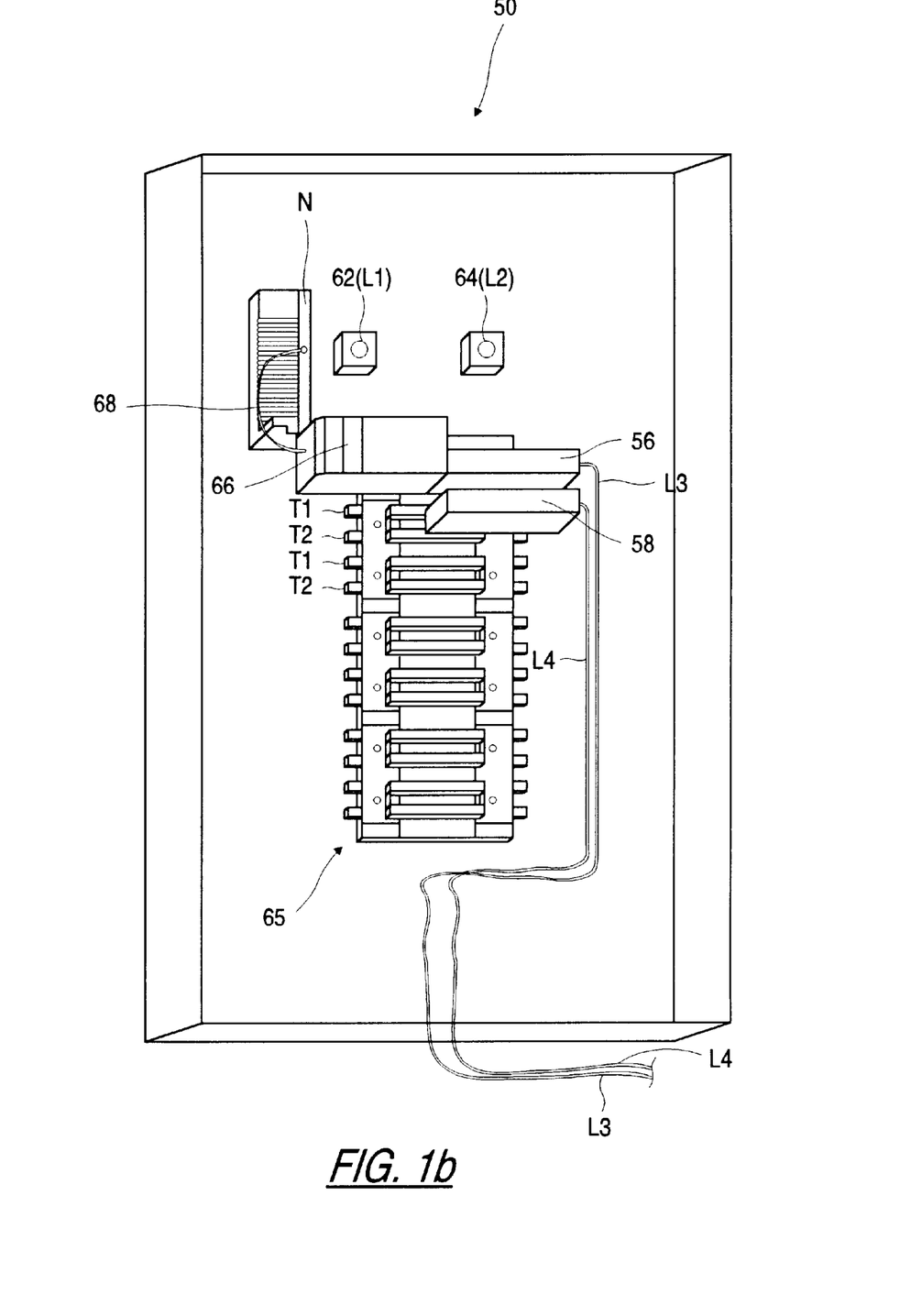
FIG. 1b is a perspective view of a panelboard which uses an isolation device according to principles of the present invention.

Turning now to FIG. 1b, there is depicted a panelboard 50 which may be used to house the isolation device according to the present invention. As used herein, the term "panelboard" is intended to encompass electrical distribution devices having current capabilities suitable for residential, commercial, or industrial uses. The panelboard 50 transmits electrical power from a utility source to a plurality of branch circuits through line buses L1 and L2 and a neutral bus N. Each branch circuit comprises a line and neutral conductor for delivering electrical power from the panelboard to a load. As shown in FIG. 1b, the branch circuits comprise line conductors L3 and L4 and respective neutral conductors (not shown) for delivering electrical power to respective loads (not shown). Each of the line conductors L3 and L4 is electrically connected to one of the line buses L1 or L2 and the neutral conductors are electrically connected to the neutral bus N at the distribution panel. Each of the line conductors L3 and L4 are routed through respective line interrupters 56 and 58.

The line buses L1 and L2 and the neutral bus N are typically at 240 volts or 120 volts, and a frequency of 60 Hz and enter the panelboard at main lugs 62 and 64. A series of bus bar tabs T1 and T2 extend in alternating fashion along the length of distribution center 65. Each of the tabs T1 are electrically connected to line bus L1 and each of the tabs T2 are electrically connected to line bus L2. (The electrical connection between tabs T1, T2 and line buses L1, L2 is not visible in FIG. 1b.) A dual pole isolation device 66 is connected to one of the tab pairs T1, T2 (not visible in FIG. 1b), thus is electrically connected to both line buses L1 and L2. The dual pole isolation device 66 is electrically connected to the neutral bus N through pig-tail wire 68. As discussed briefly above, the isolation device 66 is designed to ensure that arcing fault signals are "isolated" to the branch circuit in which they occur. For example, the isolation device 66 shown in FIG. 1b ensures that arcing fault signals present on line conductor L3 do not cross over to line conductor L4, and vice versa.

Figure 1C:
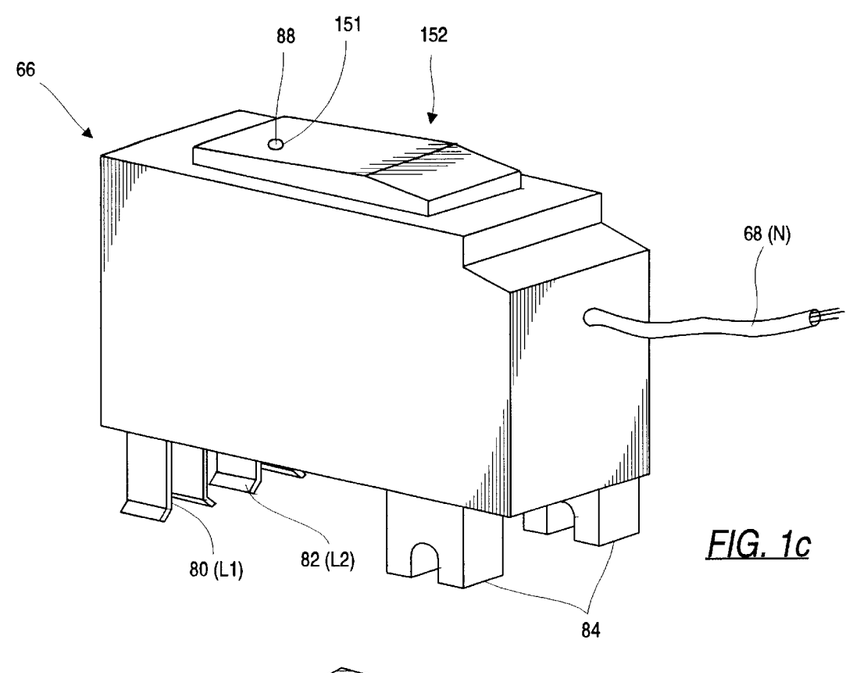
FIG. 1c is a perspective view of an isolation device according to principles of the present invention.
Figure 1D:
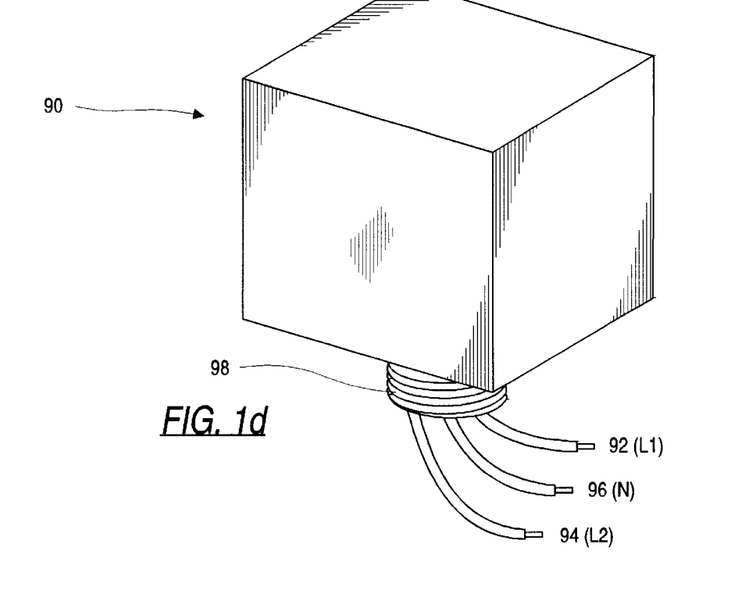
FIG. 1d is a perspective view of an alternate isolation device according to principles of the present invention.

The exterior housing of the dual-pole isolation device 66 is illustrated in more detail in FIG. 1c. The housing is designed to approximate the envelope of a two-pole circuit breaker of the type normally installed in a circuit breaker panel. Jaws 80 and 82 on one side of the isolation device 66 are each adapted to plug onto one of the bus bar tabs T1, T2 of the distribution panel and thus provide an electrical connection to respective line buses L1 and L2. For instance, jaw 80 may be electrically connected to line bus L1 through connection to bus bar tab T1 and jaw 82 may be electrically connected to line bus L2 through connection to bus bar tab T2. Rail clips 84 on another side of the isolation device 66 are adapted to plug onto a mounting rail in the panelboard to help retain the isolation device 66 firmly in position in the panelboard. Pig-tail wire 68 connects the device to the neutral bus N. As will be described below, a window 151 in a top wall 152 of the housing allows a user to see an LED 88 inside the device. In the alternative arrangement of FIG. 1d, the isolation device 90 may be attached to the panelboard via connector 98. Lines 92, 94, and 96 are connected in the panelboard to line buses L1, L2 and neutral bus N, respectively.

Referring once again to FIG. 1b, each branch circuit of the panelboard includes a line interrupter 56 or 58 designed to disconnect the load from the power source in any of the branch circuits in which an arcing fault occurs. In a preferred embodiment, each of the line interrupters 56 or 58 comprises a circuit breaker having a trip mechanism which trips the breaker contacts to an open circuit condition in response to characteristics of arcing faults, as is known in the art. One preferred method of detecting arcing faults is disclosed in pending U.S. patent application Ser. No. 08/600,512 filed Feb. 13, 1996, for "Arcing Fault Detection System", assigned to the assignee of the present invention and incorporated herein by reference. The circuit breaker may also respond to overload conditions having thermal/magnetic characteristics, as is known in the art. It is also known to provide the circuit breaker with ground fault interrupter circuitry responding to a line or neutral-to-ground fault to energize a trip solenoid which trips the circuit breaker and opens the contacts.

The line interrupters may comprise a circuit breaker, fuse, relay automatic switch or any suitable means known in the art. The line interrupters need not be the same type in each of the branch circuits. The line interrupters may be plugged onto or bolted to one of the distribution buses L1 or L2 or they may be mounted separately within the panelboard and connected to one of the distribution buses L1 or L2 by wire.

As mentioned above, the panelboard 50 includes a dual-pole isolation device 66 for electrically isolating arcing faults in the appropriate branch circuit and for increasing the signal strength of the arcing fault signal in the appropriate branch circuit. The isolation device 66 is preferably mounted near the electrical supply source connection within the panelboard. It may be plugged in or bolted onto the neutral bus and the distribution buses L1 and L2, or it may be connected to the bus lines by wire. Preferably, the dual-pole isolation device 66 will include surge protection circuitry to protect either of the distribution buses L1 or L2 from voltage surges. Alternatively, two single-pole isolation devices may be provided, each being connected to the neutral bus N and one of the distribution buses L1 or L2.

Alternatively, the electrical distribution system may include branch isolation modules (not shown) in one or more of the individual branch circuits to accomplish the same function as the dual-pole isolation module 66 shown in FIG. 1b. However, if branch isolation modules are used, the line interrupters 56 and 58 shown in FIG. 1b must not comprise arcing fault detectors because isolation modules must be positioned on the power source side of an arcing fault detector in any given branch circuit. Accordingly, if branch isolation modules are used, arcing fault detection must be provided either by separate arcing fault detector modules (not shown) positioned on a load side of the branch isolation modules, or by combined arcing fault detector and isolation modules (not shown) in which the arcing fault detector portion is positioned on the load side of the isolation portion.

Figure 2:
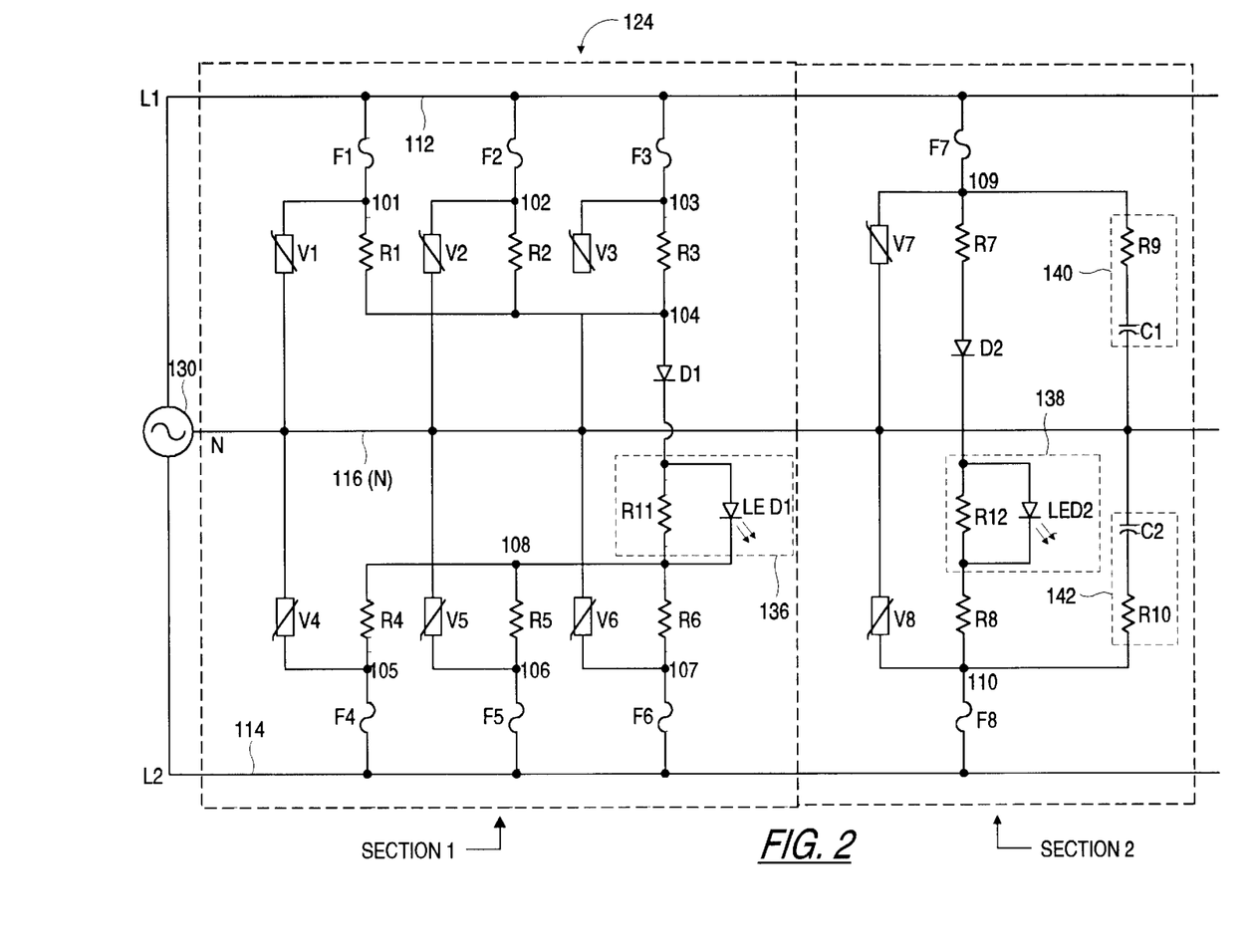
FIG. 2 is a circuit diagram of the isolation device according to principles of the present invention.

As shown in FIG. 2, a dual-pole isolation device 124 is connected to supply source 130 via line buses L1 and L2 and neutral bus N. The isolation device 124 includes both surge protection circuitry (section 1) and isolation circuitry (section 2). However, it will be appreciated that device 124 may contain only isolation circuitry.

Referring initially to the surge protection circuitry (section 1) and, more specifically, to the portion of section 1 located between the line bus L1 and neutral bus N, there is provided a plurality of fuses F1, F2, F3 connected between the line bus L1 and nodes 101, 102, and 103 respectively. Varistors V1, V2, and V3 are connected between nodes 101, 102, and 103, respectively, and the neutral bus N. Preferably, the varistors are metal oxide varistors using zinc oxide. Resistors R1, R2, R3 are connected between nodes 101, 102, and 103, respectively, and node 104.

Fuses F1, F2, and F3 open if the respective varistors V1, V2, and V3 fail, that is if a destructive surge occurs. Resistors R1, R2, and R3 form a resistance ladder which develops a voltage across display resistor R11. Diode D1 provides a forward bias between node 104 and the first display 136.

Now referring to the remainder of the surge protection circuitry (section 1) located between the line bus L2 and the neutral bus N, there is provided a plurality of fuses F4, F5 and F6 connected between the line bus L2 and nodes 105, 106 and 107 respectively. Varistors V4, V5 and V6 are connected between nodes 105, 106 and 107, respectively, and the neutral bus N. Resistors R4, R5 and R6 are connected between node 105, 106 and 107 respectively and node 108. The fuses F4, F5 and F6 are designed to open if the respective varistors V4, V5 and V6 fail.

Display 136 comprises a resistor R11 connected in parallel with a light emitting diode LEDI visible through an opening 151 in a top wall 152 of isolation module 66 (shown in FIG. 1c). LED 1 provides for monitoring the status condition of varistor and fuse pairs such as V1 and F1. The intensity of LED1 decreases when a fuse is blown. When only a predetermined number of varistor and fuse pairs remain operational, LED1 will extinguish entirely to signal for replacement of the surge protection circuitry.

Specifically, the light output of LED1 varies with the operating condition of each varistor and fuse pair. Display 136 uses the first plurality of resistors R1, R2 and R3, the second plurality of resistors R4, R5 and R6, diode D1, resistor R11 and LED1 to indicate when the circuit is operating correctly. The resistance ladder of the first set of resistors R1–R3 monitors the fuses F1, F2 and F3 on line bus L1 and the second set of resistors R4–R6 monitors the fuses F4, F5 and F6 and the line bus L2. Line buses L1 and L2 each develop a voltage across resistor R11 that is proportional to the number of conducting fuses Fl, F2, F3, F4, F5, F6. Only when a preselected number of these fuses are intact will sufficient voltage be available to forward bias LED1 to emit a signal to indicate that the surge protection circuitry is operational.

The above-described surge arrestor circuit is designed to limit the voltage between line bus L1 and neutral bus N upon the occurrence of a voltage surge. The operation of the surge arrestor circuit is described in detail in U.S. Pat. No. 5,412,526, hereby incorporated by reference.

Referring next to the isolation circuitry (section 2) of FIG. 2 and, more specifically, to the portion of section 2 located between the line bus L1 and neutral bus N, there is provided a fuse F7 connected between the line bus L1 and a node 109. A filter 140 consisting of a capacitor C1 in series with a resistor R9, is connected between the node 109 and the neutral bus N. Filter 140 is designed to effectively short high-frequency arcing fault signals from line bus L1 to neutral bus N, thus preventing arcing fault signals on line bus L1 from crossing over to line bus L2. In completing the arcing fault signal path from line bus L1 to neutral bus N, the filter 140 accomplishes two functions. First, it prevents an arcing fault detector (not shown) on line bus L2 from detecting a "false" arcing fault signal on line bus L2. Second, it increases the signal strength at an arcing fault detector (not shown) positioned on line bus L1 on a load side of filter 140. Varistor V7 is connected between the node 109 and the neutral bus N. Varistor V7 provides a degree of surge protection for the isolation circuitry connected between the line bus L1 and the neutral bus N. A resistor R7 and a diode D2 are connected in series between the node 109 and a display 138.

Referring now to the remainder of the isolation circuitry (section 2) located between line bus L2 and neutral bus N, there is provided a fuse F8 connected between the line bus L2 and a node 110. A filter 142 consisting of a capacitor C2 in series with a resistor R10 is connected between node 110 and the neutral bus N. Filter 142 is designed to complete the arcing fault signal path from line bus L2 to neutral bus N by effectively shorting high frequency arcing fault signals from the line bus L2 to neutral bus N. Thus, similar to the filter 140 described above, the filter 142 prevents an arcing fault detector (not shown) on line bus L1 from detecting a "false" arcing fault signal on line bus L1, and increases the signal strength at an arcing fault detector (not shown) positioned on line bus L2 on a load side of filter 142. A varistor V8 provides a degree of surge protection for the isolator circuitry connected between line bus L2 and neutral bus N. Resistor R8 is connected between node 110 and display 138.

Display 138 consists of a resistor R12 connected in parallel with an LED2. Display 138 provides a means for monitoring the operating status of the isolation circuitry. Should fuse F7 or F8 blow for any reason, causing a loss of isolator functionality, the LED2 will turn off. LED2 is visible through an opening 151 in the top wall 152 of the isolation device 66 (shown in FIG. 1c).

It will be appreciated that the design and operation of the two-pole isolation device heretofore described may be similarly applied to single-pole isolation devices or multi-pole isolation devices. The circuit for a single-pole isolation device will be substantially similar to the above-described two-pole isolation device, the difference being that it will contain only the circuitry of sections 1 and 2 located between the line bus L1 and neutral bus N.

Thus, an electrical isolation device is provided where faults are isolated to the electrical branch of the electrical distribution network where they occur. The isolation device can be a single-pole, dual-pole or multiple-pole device and is adaptable for use on the power source side of an arcing fault detector. The device can be constructed such that it is adaptable for use in a variety of areas of an electrical panelboard. The isolation device also contains circuitry which suppresses voltage surges occurring in the electrical distribution network.

While the present invention has been described with reference to one or more preferred embodiments, those skilled in the art will recognize that many changes may be made thereto without departing from the spirit and scope of the present invention, which is set forth in the following claims.

We claim:

1. An electrical isolation device for use in an electrical distribution panelboard, said panelboard including at least one line bus and a neutral bus for distributing electrical power to a plurality of branch circuits electrically connected to said panelboard, said isolation device comprising:

a filter providing a low impedance path for an arcing fault signal occurring in any of said branch circuits, said path extending between said at least one line bus and said neutral bus in said panelboard, said path effectively shorting said arcing fault signal at said panelboard and preventing said arcing fault signal from crossing over to any other of said branch circuits.

2. The electrical isolation device of claim 1 wherein said filter comprises a resistor and capacitor in series.

3. The electrical isolation device of claim 1 further comprising a surge protector coupled between said at least one line bus and said neutral bus, said surge protector protecting said plurality of branch circuits from electrical surges occurring on said at least one line bus.

4. The electrical isolation device of claim 1 wherein said device is housed within an isolation module connected to said at least one line bus and said neutral bus and mounted to said panelboard.

5. The electrical isolation device of claim 1 including a display coupled to said filter for indicating the condition of said isolation device.

6. The electrical isolation device of claim 5 where said display comprises a light emitting diode.

7. In combination, a panelboard for receiving and distributing power from a utility source and an isolation module for said panelboard, said panelboard receiving said power through at least one line bus and a neutral bus, the panelboard distributing said power from said at least one line bus and said neutral bus to a plurality of branch circuits each having line and neutral conductors for delivering said power to a load, said isolation module electrically connected to said at least one line bus and neutral bus in said panelboard and comprising:

a resistor and a capacitor connected in series between said at least one line bus and said neutral bus, said resistor and capacitor providing a low impedance path for an arcing fault signal occurring in any of said branch circuits, said path effectively isolating said arcing fault signal to the branch circuit on which it occurred and preventing arcing fault detectors in any other of said branch circuits from detecting said arcing fault signal.

8. In combination, a panelboard for receiving and distributing power from a utility source and an isolation module for said panelboard, said panelboard receiving said power through a first and second line bus and a neutral bus, the panelboard distributing said power from said first and second line bus and said neutral bus to a plurality of branch circuits each having line and neutral conductors for delivering said power to a load, said isolation module electrically connected to said first and second line bus and neutral bus in said panelboard and comprising:
   a first set of components defining a resistor and capacitor connected in series between said first line bus and said neutral bus;
   a second set of components defining a resistor and capacitor connected in series between said second line bus and said neutral bus;
   said first and second sets of components providing respective low impedance paths for arcing fault signals occurring in any of said branch circuits, said paths effectively isolating said arcing fault signals to the branch circuits on which they occur and preventing arcing fault detectors in any other of said branch circuits from detecting said arcing fault signals.

9. An electrical isolation device for use in an electrical distribution panelboard, said panelboard including a first and second line bus and a neutral bus for distributing electrical power to a plurality of branch circuits electrically connected to said panelboard, said isolation device comprising:
   a first filter and a second filter each comprised of a resistor and capacitor in series and providing a respective low impedance path for an arcing fault signal occurring in any of said branch circuits, one of said paths extending between said first line bus and said neutral bus, the other of said paths extending between said second line bus and said neutral bus each of said respective paths effectively shorting said arcing fault signal at said panelboard and preventing said arcing fault signal from crossing over to any other of said branch circuits;
   a first surge protector coupled between first line bus and said neutral bus, said first surge protector protecting said plurality of branch circuits from electrical surges occurring on said first line bus;
   a second surge protector coupled between second line bus and said neutral bus, said second surge protector protecting said plurality of branch circuits from electrical surges occurring on said second line bus; and
   a display coupled to said first and second filters for indicating the condition of said isolation device, said display comprising a light emitting diode.

10. The electrical isolation device of claim 9 wherein said device is housed within an isolation module connected to said first and second line buses and said neutral bus and mounted to said panelboard.

11. An electrical isolation device for use in an electrical distribution panelboard, said panelboard including at least one line bus and a neutral bus for distributing electrical power to a plurality of branch circuits electrically connected to said panelboard, said isolation device comprising:
   filter means for providing a low impedance path for an arcing fault signal occurring in any of said branch circuits, said path extending between said at least one line bus and said neutral bus in said panelboard, said path effectively shorting said arcing fault signal at said panelboard and preventing said arcing fault signal from crossing over to any other of said branch circuits.

12. The electrical isolation device of claim 11 wherein said filter means comprises a resistor and capacitor in series.

13. The electrical isolation device of claim 11 further comprising surge protection means coupled between said at least one line bus and said neutral bus for protecting said plurality of branch circuits from electrical surges occurring on said at least one line bus.

14. The electrical isolation device of claim 11 including display means coupled to said filter means for indicating the condition of the isolation device.

15. The electrical isolation device of claim 14 where said display means comprises a light emitting diode.

16. An electrical isolation device for use in an electrical distribution panelboard, said panelboard including a first and second line bus and a neutral bus for distributing electrical power to a plurality of branch circuits electrically connected to said panelboard, said isolation device comprising:
   a first filter and a second filter each providing a respective low impedance path for an arcing fault signal occurring in any of said branch circuits, one of said paths extending between said first line bus and said neutral bus, the other of said paths extending between said second line bus and said neutral bus, each of said respective paths effectively shorting said arcing fault signal at said panelboard and preventing said arcing fault signal from crossing over to any other of said branch circuits.

17. The electrical isolation device of claim 16 wherein said first filter comprises a resistor and capacitor in series and said second filter comprises a resistor and capacitor in series.

18. The electrical isolation device of claim 16 further comprising:
   a first surge protector coupled between said first line bus and said neutral bus; said first surge protector protecting said plurality of branch circuits from electrical surges occurring on said first line bus; and
   a second surge protector coupled between said second line bus and said neutral bus, said second surge protector protecting said plurality of branch circuits from electrical surges occurring on said second line bus.

19. The electrical isolation device of claim 16 wherein said device is housed within an isolation module connected to said first and second line buses and said neutral bus and mounted to said panelboard.

20. The electrical isolation device of claim 16 including a display coupled to said first and second filters for indicating the condition of said isolation device.

21. The electrical isolation device of claim 20 where said display comprises a light emitting diode.

22. An electrical isolation device for use in an electrical distribution network including at least one line bus and a neutral bus for receiving electrical power from a power source and distributing said electrical power to a plurality of branch circuits, each of said branch circuits including an arcing fault detector for interrupting electrical current in an associated branch circuit upon detecting characteristics of arcing faults in said associated branch circuit, said isolation device comprising:
   a filter connected between said at least one line bus and said neutral bus and on a power source side of the arcing fault detector in each of said branch circuits, said filter providing a low impedance path for an arcing fault signal occurring in any of said branch circuits, said path effectively isolating said arcing fault signal to the branch circuit on which it occurred and preventing arcing fault detectors in any other of said branch circuits from detecting said arcing fault signal.

23. The electrical distribution device of claim 22 wherein said filter comprises a resistor and capacitor in series.

24. The electrical isolation device of claim 23 further comprising a surge protector coupled between said at least one line bus and said neutral bus, said surge protector protecting said plurality of branch circuits from electrical surges occurring on said at least one line bus.

25. The electrical isolation device of claim 22 wherein said device is housed within a single-pole isolation module connected to said at least one line bus and said neutral bus and mounted to said panelboard.

26. The electrical isolation device of claim 25 wherein said isolation module includes a display coupled to said filter for indicating the condition of said isolation device.

27. An electrical isolation device for use in an electrical distribution network including a first and second line bus and a neutral bus for receiving electrical power from a power source and distributing said electrical power to a plurality of branch circuits, each of said branch circuits including an arcing fault detector for interrupting electrical current in an associated branch circuit upon detecting characteristics of arcing faults in said associated branch circuit, said isolation device comprising:

a first and second filter each connected between a respective one of said first and second line buses and said neutral bus on a power source side of the arcing fault detectors in said branch circuits, said first and second filters each providing a low impedance path for an arcing fault signal occurring in any of said branch circuits, each of said paths effectively isolating said arcing fault signal to the branch circuit on which it occurred and preventing arcing fault detectors in any other of said branch circuits from detecting said arcing fault signal.

28. The electrical distribution device of claim 27 wherein said first and second filters each comprises a resistor and capacitor in series.

29. The electrical isolation device of claim 28 further comprising a first and second surge protector each coupled between a respective one of said first and second line buses and said neutral bus, said surge protector protecting said plurality of branch circuits from electrical surges occurring on said first and second line buses.

30. The electrical isolation device of claim 27 wherein said device is housed within a dual-pole isolation module connected to said first and second line buses and said neutral bus and mounted to said panelboard.

31. The electrical isolation device of claim 30 wherein said isolation module includes a display coupled to said filter for indicating the condition of said isolation device.

* * * * *